(12) United States Patent
Drost et al.

(10) Patent No.: US 7,949,436 B2
(45) Date of Patent: May 24, 2011

(54) METHOD AND APPARATUS FOR AUTOMATICALLY DETECTING AND CORRECTING MISALIGNMENT OF A SEMICONDUCTOR CHIP

(75) Inventors: Robert J. Drost, Los Altos, CA (US); Ronald Ho, Mountain View, CA (US); David C. Douglas, Palo Alto, CA (US)

(73) Assignee: Oracle America, Inc., Redwood Shores, CA (US)

( * ) Notice: Subject to any disclaimer, the term of this patent is extended or adjusted under 35 U.S.C. 154(b) by 328 days.

(21) Appl. No.: 11/437,456

(22) Filed: May 19, 2006

(65) Prior Publication Data

US 2007/0266557 A1    Nov. 22, 2007

(51) Int. Cl.
*G05D 1/02* (2006.01)
(52) U.S. Cl. .................................... 700/302; 700/121
(58) Field of Classification Search .............. 700/302, 700/121, 109–110; 438/14, 16, 127
See application file for complete search history.

(56) References Cited

U.S. PATENT DOCUMENTS

| | | | | |
|---|---|---|---|---|
| 6,221,681 B1 * | 4/2001 | Sugasawara | ............ | 438/14 |
| 6,406,940 B1 * | 6/2002 | Chen | ............ | 438/109 |
| 6,710,436 B1 * | 3/2004 | Harris et al. | ............ | 257/686 |
| 6,812,046 B2 * | 11/2004 | Drost et al. | ............ | 438/14 |
| 6,870,271 B2 * | 3/2005 | Sutherland et al. | ............ | 257/777 |
| 6,936,493 B1 * | 8/2005 | Michalicek | ............ | 438/52 |
| 6,995,039 B2 * | 2/2006 | Harris et al. | ............ | 438/107 |
| 7,141,450 B2 * | 11/2006 | Pardo | ............ | 438/108 |
| 7,279,789 B2 * | 10/2007 | Cheng | ............ | 257/713 |
| 7,357,035 B2 * | 4/2008 | Liu et al. | ............ | 73/756 |
| 2003/0118308 A1 * | 6/2003 | Bricheno | ............ | 385/129 |
| 2005/0054139 A1 * | 3/2005 | Drost et al. | ............ | 438/106 |
| 2006/0150709 A1 * | 7/2006 | Deb et al. | ............ | 73/1.38 |
| 2006/0220224 A1 * | 10/2006 | Cheng | ............ | 257/706 |

FOREIGN PATENT DOCUMENTS

WO    WO 03/069389 A1 *    8/2003

OTHER PUBLICATIONS

Drost et al. "Proximity Communication"; Sep. 2004; IEEE Jouranl of Solid-State Circuits; vol. 39; No. 9 pp. 1529-1535.*
Bernabe et al. "Highly Integrated VCSEL-Based 10Gb/s Miniature Optical Sub-Assembly"; 2005, IEEE, pp. 1333-1338.*
Drost et al.; "Electronic Alignment for Proximity Comunication"; Feb. 17, 2004; IEEE International Solid-State Circuits Conference; Section 7.7; pp. 1-10.*

* cited by examiner

*Primary Examiner* — Albert Decady
*Assistant Examiner* — Chad Rapp
(74) *Attorney, Agent, or Firm* — Park, Vaughan, Fleming & Dowler LLP

(57) ABSTRACT

One embodiment of the present invention provides a system that automatically detects and corrects a misalignment of a semiconductor chip. During operation, the system uses a position-detection mechanism integrated with the chip to determine the misalignment of the chip from a desired alignment for the chip. Next, the system uses an actuation mechanism integrated with the chip to automatically correct the misalignment, thereby improving performance and reliability of the chip.

19 Claims, 3 Drawing Sheets

METHOD AND APPARATUS FOR AUTOMATICALLY DETECTING AND CORRECTING MISALIGNMENT OF A SEMICONDUCTOR CHIP

GOVERNMENT LICENSE RIGHTS

This invention was made with United States Government support under Contract No. NBCH3039002 awarded by the Defense Advanced Research Projects Administration. The United States Government has certain rights in the invention.

BACKGROUND

1. Field of the Invention

The present invention relates to semiconductor chips. More specifically, the present invention relates to a method and an apparatus for automatically detecting and correcting mechanical misalignment of a semiconductor chip.

2. Related Art

During the process of manufacturing a computing system, a semiconductor chip is typically integrated into a computing system at a desired location on a printed circuit board (PCB) or on some other type of chip carrier module. Typically, the position of a chip on the PCB or the carrier module can affect chip performance. Even a small deviation from this desired chip location due to a mechanical misalignment of the chip can seriously degrade chip performance or even cause system failure.

Typically, the location of a chip is fixed because the chip is mechanically soldered or wire-bonded onto the PCB or carrier. It is then assumed that the chip position will not change with respect to: surrounding signal lines (in the PCB or carrier), neighboring chips, and other system components. Unfortunately, even when the chip is mechanically attached to the PCB or carrier, a mechanical misalignment can still occur due to environment changes, such as a temperature variation which induces thermal expansion or contraction of the chip and/or the PCB or carrier. Furthermore, mechanical vibration of the PCB or carrier to which the chip is attached can also cause mechanical misalignment of the chip. Yet another example involves a system comprising a chip-optical fiber assembly, which typically requires even higher mechanical alignment precisions during the attachment between the chip and the optical fiber, wherein a sub-micron misalignment can cause significant light coupling losses.

As the integration and packaging densities continue to increase, the magnitude of above mechanical misalignments have become more significant in comparison to circuit dimensions or size of the fibers. Consequently, significantly more precise chip alignment is required.

Mechanical misalignment also occurs due to aberrant movement of a chip when the chip is mechanically floating in relation to other chips. For example, in a system that supports proximity communication through capacitive coupling between neighboring chips, the effectiveness of the communication relies on precise alignment between neighboring chips, which are proximate to each other, but not mechanically attached to each other.

Existing techniques for dealing with alignment problems generally involve time-consuming manual alignment operations. Furthermore, these alignment operations require the system to be turned off and disassembled, which can adversely affect system availability.

Hence, what is needed is a method and an apparatus for automatically detecting and correcting misalignment between semiconductor chips in order to improve system performance.

SUMMARY

One embodiment of the present invention provides a system that automatically detects and corrects a misalignment of a semiconductor chip. During operation, the system uses a position-detection mechanism integrated with the chip to determine the misalignment of the chip from a desired alignment for the chip. Next, the system uses an actuation mechanism integrated with the chip to automatically correct the misalignment, thereby improving performance and reliability of the chip.

In a variation on this embodiment, the position-detection mechanism includes a position-detection sensor integrated with the chip, wherein the position-detection sensor can include: an optical sensor; a capacitive sensor; an inductive sensor; or a conductive sensor.

In a variation on this embodiment, the actuation mechanism can include: a piezo-electric actuator; an electro-static actuator; an electro-thermal actuator; or an inductive actuator.

In a variation on this embodiment, the desired alignment of the chip is with respect to a second chip to facilitate interactions between the chip and the second chip.

In a variation on this embodiment, the system performs the alignment detection and correction with closed-loop control, wherein the misalignment is automatically determined by the integrated sensor, and wherein the integrated actuator automatically corrects the misalignment.

In a variation on this embodiment, correcting the misalignment involves removing the chip from operation if the system determines that the misalignment may cause a possible system failure.

In a variation on this embodiment, the method is applied to a set of chips, wherein the system automatically detects and corrects the misalignment of each chip with respect to neighboring chips in the set of chips either during assembly or operation of a system which includes the set of chips.

In a variation on this embodiment, the misalignment of the chip may be caused by: movement of the chip; thermal expansion or contraction of the chip and/or surrounding system components; or vibration of an assembly to which the chip is affixed.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Automatic Misalignment Detection and Correction

One embodiment of the present invention allows automatic detection and correction of a misalignment of a chip from a desired location on a chip carrier, such as a printed circuit board (PCB), thereby improving system performance and reliability. The alignment of the chip can be with respect to a neighboring chip integrated onto the same PCB, or a neighboring chip integrated onto a neighboring PCB. In either case, a misalignment of the chip with respect to the neighboring chip can degrade interactions between the chip and the neighboring chip. Furthermore, the alignment of the chip can be with respect to other non-chip components integrated onto the PCB or carrier, such as interconnections, signal lines, power supplies or heat sinks, wherein a misalignment with respect to such components may cause additional chip performance and reliability issues.

Figure 1:
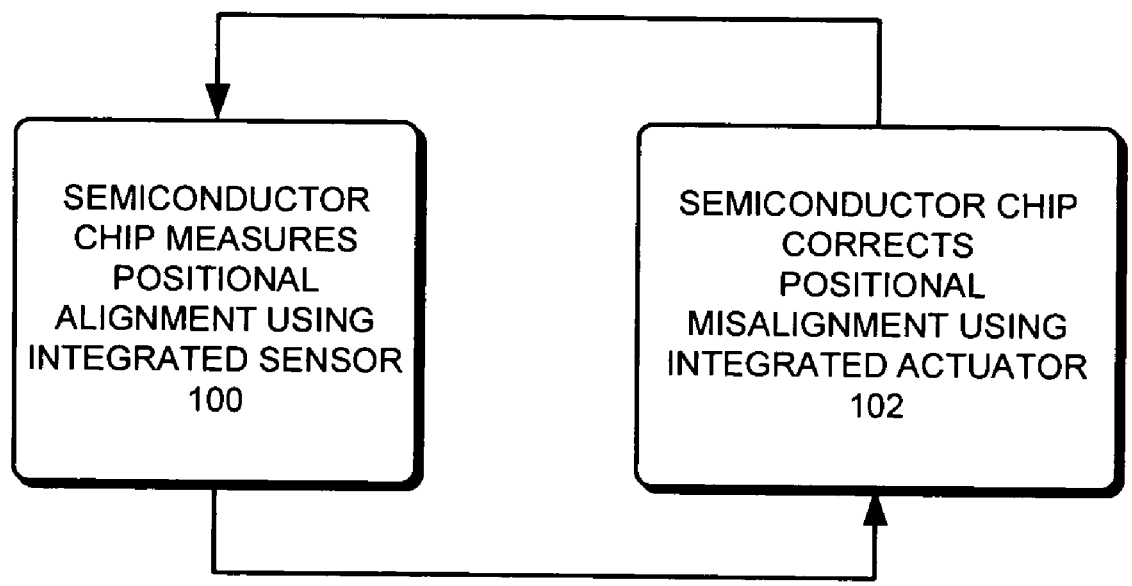
FIG. 1 illustrates the automatic misalignment detection and correction process for a chip in accordance with an embodiment of the present invention.

FIG. 1 illustrates the automatic misalignment detection and correction process for a chip in accordance with an embodiment of the present invention. In order to detect the misalignment, the chip includes an integrated position-detection mechanism. This position-detection mechanism includes a position-detection sensor integrated with the chip and corresponding integrated circuits. The sensor may be fabricated during the chip manufacturing process so that the sensor is part of the chip. Alternatively, the sensor may be manufactured separately and later mechanically bonded to the chip. In both implementations, the integrated sensor can measure a present chip position with respect to a desired chip position (step 100). Note that the integrated sensor can include an optical sensor, a capacitive sensor, an inductive sensor, a conductive sensor, or other types of sensors that can measure a position change for the chip.

Next, the chip corrects the misalignment using an integrated actuator integrated with the chip (step 102). Note that the integrated actuator can include a piezo-electric actuator, an electro-static actuator, an electro-thermal actuator, an inductive actuator, or other types of actuators that can cause the chip to move in a desired direction. Note that the integrated actuator receives correction signals from the integrated sensor and associated integrated circuits.

The detection and correction process in FIG. 1 can be performed with closed-loop control, such that the misalignment is automatically determined by the integrated sensor, and the integrated actuator automatically corrects the misalignment. This automation is facilitated by sensor circuitry and actuator control circuitry, which interact with each other. During operation, step 100 and step 102 can repeat indefinitely, so that the chip position always approximates a desired position for optimal chip performance.

Communication Applications

Proximity communication enables faster, lower-cost chip-to-chip communication. For example, in a system that uses proximity communication, chips are placed in a face-to-face arrangement so that the transmitter circuit in a sending chip is aligned with the receiver circuit in the receiving chip with only microns of distance between them. One communication mechanism for proximity communication involves capacitive coupling. Alternative communication mechanisms for proximity communication can include optical, inductive or conductive communication mechanisms. Since the precise alignment between the sending and receiving chips is important for the performance of proximity communication, misalignment detection and correction can facilitate proximity communication.

Figure 2:
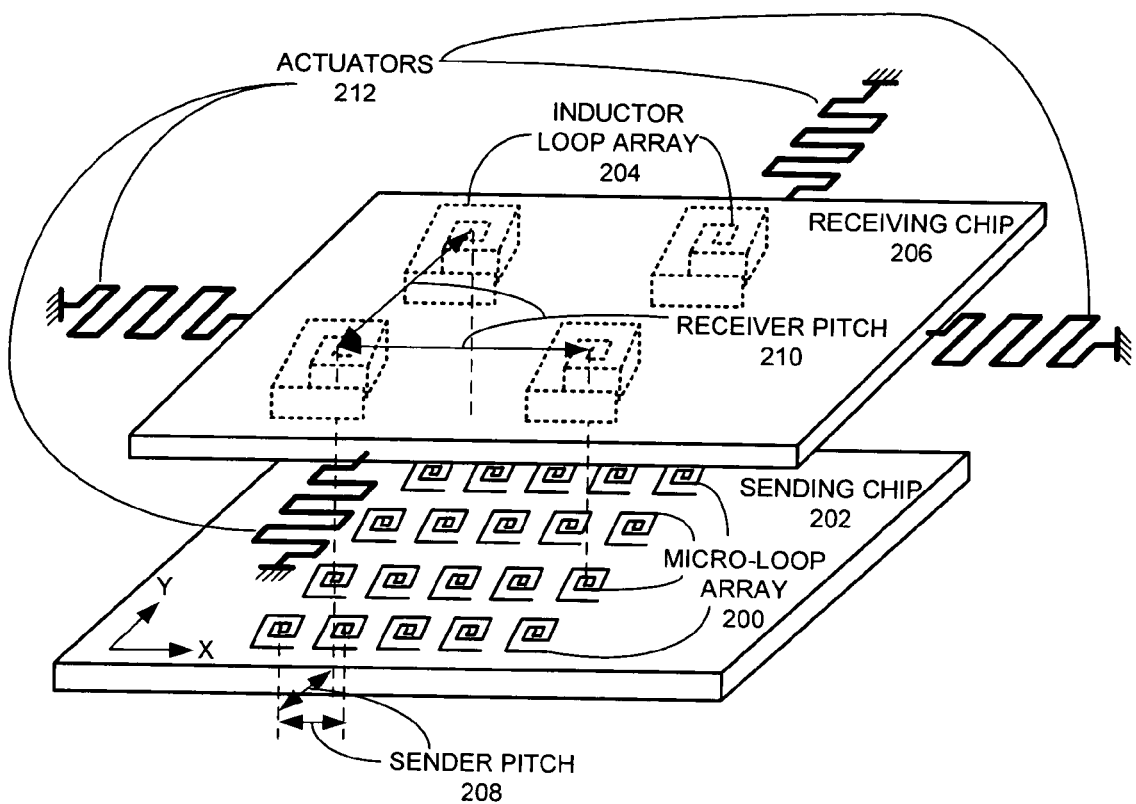
FIG. 2 illustrates proximity communication through inductive coupling with misalignment detection and correction in accordance with an embodiment of the present invention.

FIG. 2 illustrates proximity communication through inductive coupling with misalignment detection and correction in accordance with an embodiment of the present invention. In FIG. 2, an array of micro-loops 200 on a sending chip 202 communicates with an array of inductor loops 204 on a receiving chip 206. Specifically, data can be transmitted from sending chip 202 to receiving chip 206 by switching the polarization of magnetic fields generated by micro-loops in array 200.

During communication operations, receiving chip 206 constantly monitors a coupling inductance between a micro-loop in array 200 and an inductor loop in array 204. By mapping the magnitude of the coupling inductances between the two arrays, receiver chip 206 can determine the relative positions of the two arrays, and subsequently determine the mechanical misalignment between the two chips. Note that array 200 of sending chip 202 has a sender pitch 208, while array 204 of receiving chip 206 has a receiver pitch 210, wherein sender pitch 208 is finer than receiver pitch 210. This arrangement forms a two-dimensional Vernier pattern, which can be used to accurately measure mechanical misalignment in both X and Y directions. A more-detailed description of chip misalignment measurement with the Vernier patterns can be found in U.S. patent application Ser. No. 10/741,961, entitled, "Method and Apparatus for Aligning Semiconductor Chips Using an Actively Driven Vernier."

Next, the measured misalignment can be used to generate correction signals which are then used to correct the misalignment of receiving chip 206 with respect to sending chip 202. This alignment correction facilitates optimal communication speed and reliability between the two chips.

In one embodiment of the present invention, actuators 212 integrated with receiving chip 206 are used to realign sending chip 202 and receiving chip 206. In this embodiment, actuators 212 can be microelectromechanical (MEMS) actuators, which are fabricated using microfabrication processes. More specifically, actuators 212 can be piezo-electric actuators which can induce expansion or contraction in accordance with an applied electrical field. Alternatively, actuators 212 can be electro-static actuators which generate an electrostatic force in accordance with an applied voltage. Actuators 212 can also be electro-thermal actuators which facilitate actuation through expansion and contraction of resistive structures when such structures are thermally activated by signal currents. Additionally, actuators 212 can be inductive actuators which generate a magnetic force in accordance with input current signals. Note that, actuators 212 can alternatively be integrated with sending chip 202 instead of with receiving chip 206.

Figure 3:
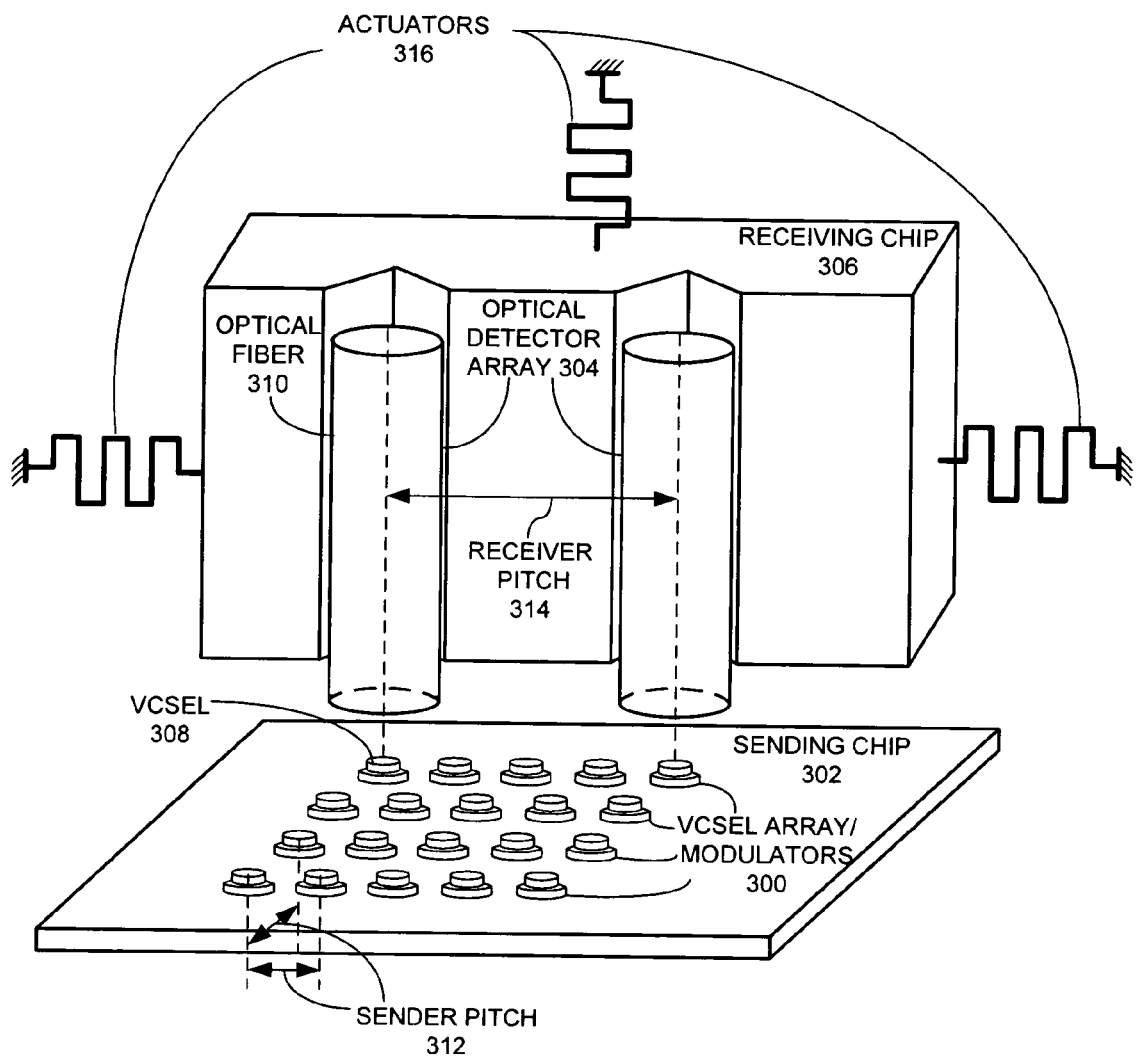
FIG. 3 illustrates a communication scheme using optical coupling with misalignment detection and correction in accordance with an embodiment of the present invention.

FIG. 3 illustrates a communication scheme using optical coupling with misalignment detection and correction in accordance with an embodiment of the present invention. In FIG. 3, an array of Vertical Cavity Surface Emitting Lasers (VCSELs) or modulators 300 on a sending chip 302 communicates with an array of optical detectors 304, such as photodetectors or optical fibers, on a receiving chip 306. Data can be transmitted between a VCSEL and an optical detector by modulating the VCSEL light emission, for example, by turning on the VCSEL to represent "1" and turning off the VCSEL to represent "0".

During communication operations, data can also be "steered" through VCSEL array 300 to compensate for mechanical misalignments between sending chip 302 and receiving chip 306. In the embodiment illustrated in FIG. 3, VCSEL 308 is aligned with optical fiber 310. When the data is "steered" to VCSEL 308, which then emits light, optical fiber 310 receives strongest optical signal. Receiving chip 306 can use this information to determine the relative positions of the two arrays, and to subsequently determine the mechanical misalignment between the two chips. Note that array 300 on sending chip 302 has a sender pitch 312, while array 304 on receiving chip 306 has a receiver pitch 314, wherein sender pitch 312 is finer than receiver pitch 314. This arrangement again forms a two-dimensional Vernier pattern for the accurate measurement of misalignment. Next, the measured misalignment signal can be used for position correction by using actuators 316 integrated with receiver chip 306.

Note that the above-described systems have sending chips with a finer pitch than the receiving chips in the Vernier pattern. The Vernier pattern can also be formed with receiving chips having a finer pitch than the sending chips.

Furthermore, the above-described systems only involve two neighboring chips. It should be apparent to one of ordinary skill in the art to apply the same method to a system that includes more than two chips to automatically detect and correct misalignment of chips.

Chip Assembly

The present invention can also facilitate chip assembly operations. For example, in the embodiment illustrated in FIG. 3, sending chip 302 can be integrated with a position-detection sensor. After sending chip 302 and receiving chip 306 are initially assembled, sending chip 302 can report on its alignment to fiber array 304, receiving chip 306, or a chip carrier of receiving chip 306. This alignment information can aid assembly engineers in tuning the assembly to an optimal alignment. Furthermore, this information can make it easier for the assembly engineers to determine if some sub-assembly parts may have been fabricated outside of specified tolerances.

Self-Healing Computers

The present invention may be applied to facilitate self-healing computers, wherein the self-healing computers monitor their operation status and correct for failing components.

In a computing system, excessive movement of a chip due to thermal shifts and mechanical vibration may cause performance degradation and possible failure. When a chip is integrated with an automatic position-detection sensor and a position-correction actuator, the chip can monitor its position and report this information to a predictive failure monitoring system. As aberrant mechanical misalignments are detected (and possibly correlated with other factors such as humidity, temperature, or voltage excursions), chips deemed to be about to fail can be gracefully removed from the operation before they cause a system failure. Such a decision is typically made by the above-mentioned predictive failure monitoring system when the measured mechanical misalignment is so large that it is beyond the correction range of the integrated actuator. In such a situation, the correction mechanism can promptly turn off the power to the faulty chips to interrupt their operation instead of attempting to correct their alignment. The interrupted chips can then be serviced or replaced at a later time.

Heat-Removal

The present invention can also remedy heat generation problems in a computing system. During operation, the computing system typically generates a certain amount of heat that can increase the temperature of the chips in the system. Such temperature increases can severely degrade chip reliability and performance, and therefore must be compensated for by heat-removal. The efficiency of heat-removal techniques depends on how well the chip is physically attached to a heat sink, which in turn depends on its mechanical alignment.

For example, a chip that slides sideways off of its heat sink, or that pulls away vertically from its heat sink will display elevated temperatures which are detectable by on-chip thermal sensors. Next, these sensors can activate alignment actuators (piezo-electric actuator, for example, or simple mechanically controlled springs) to realign the chip to the heat sink, thereby reducing the temperature and restoring the performance.

Power-Delivery

The present invention can also remedy power delivery problems in a computing system. Note that a chip packaged into a PCB or other chip carrier module needs to have power delivered into the chip, typically in the form of a current. This current may flow from the PCB or the chip carrier module directly into the chip through wire bonds or solder balls. Alternatively, this current can flow through an interposer material that couples the PCB or chip carrier module to the power pads on the chip. The efficiency of this power-delivery method depends on the accuracy of the chip alignment to the PCB, the chip carrier module, or the interposer, whichever is used.

A chip that becomes misaligned from the corresponding interposer, PCB, or chip carrier module will have correspondingly less power-delivering current delivered to it. This effectively increases the power supply impedance, causing the power supply on the chip to decrease and the associated circuits to slow down. Typically, this change in the supplied power can be detected using on-chip voltage sensors. These sensors may activate alignment actuators, including springs or piezo-electrics, to realign the chip to its power-delivery sources, thereby allowing restoring the chip performance.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for automatically detecting and correcting a misalignment between a first chip and a second chip during a data communication process, during which the second chip transmits a data signal to the first chip, wherein the data signal is transmitted from a first proximity communication structure on the second chip and is received by a second proximity communication structure on the first chip, and wherein each proximity communication structure includes an array of individual proximity communication elements, the method comprising:

receiving the data signal at the first chip from the second chip, wherein the transmitted data signal is steered through a subset of the individual proximity communication elements in the first proximity communication structure;

using a position-detection sensor integrated with the first chip to determine a misalignment of the first chip with respect to the second chip based at least on a signal strength of the received data signal, wherein determining the misalignment involves:

detecting the individual proximity communication elements in the second proximity communication structure that receive the transmitted data; and determining the relative positions of the first and second chips based on the sending and receiving individual proximity communication elements; and when a misalignment is detected between the first chip and the second chip, using an actuation mechanism integrated with the first chip to automatically correct the misalignment, wherein the automatically detecting and correcting of the misalignment are performed concurrently with the data communication process.

2. The method of claim 1, wherein the position-detection sensor includes:

an optical sensor;
a capacitive sensor;
an inductive sensor; or
a conductive sensor.

3. The method of claim 1, wherein the actuation mechanism includes:

a piezo-electric actuator;
an electro-static actuator;
an electro-thermal actuator; or
an inductive actuator.

4. The method of claim 1, wherein the desired alignment of the first chip with respect to the second chip facilitates the data communication between the first chip and the second chip.

5. The method of claim 1, wherein the method is performed with closed-loop control, wherein the misalignment is automatically determined by the integrated sensor, and the integrated actuator automatically corrects the misalignment.

6. The method of claim 1, wherein the method is applied to a set of chips, such that the method automatically detects and corrects the misalignment of each chip with respect to neighboring chips in the set of chips during either assembly or operation of a system which includes the set of chips.

7. The method of claim 1, wherein the misalignment between the first chip and the second chip is caused by at least one of:

movement of the first chip;
thermal expansion or contraction of the first chip or a chip assembly; or
vibration of an assembly to which the first chip is affixed.

8. A computer-readable storage medium storing instructions that when executed by a computer cause the computer to perform a method for automatically detecting and correcting a misalignment between a first chip and a second chip during a data communication process, during which the second chip transmits a data signal to the first chip, wherein the data signal is transmitted from a first proximity communication structure on the second chip and is received by a second proximity communication structure on the first chip, and wherein each proximity communication structure includes an array of individual proximity communication elements, the method comprising:

receiving the data signal at the first chip from the second chip, wherein the transmitted data signal is steered through a subset of the individual proximity communication elements in the first proximity communication structure;

using a position-detection sensor integrated with the first chip to determine a misalignment of the first chip with respect to the second chip based at least on a signal strength of the received data signal, wherein determining the misalignment involves:

detecting the individual proximity communication elements in the second proximity communication structure that receive the transmitted data; and determining the relative positions of the first and second chips based on the sending and receiving individual proximity communication elements; and when a misalignment is detected between the first chip and the second chip, using an actuation mechanism integrated with the first chip to automatically correct the misalignment, wherein the automatically detecting and correcting of the misalignment are performed concurrently with the data communication process.

9. The computer-readable storage medium of claim 8, wherein the position-detection sensor includes:

an optical sensor;

a capacitive sensor;

an inductive sensor; or a conductive sensor.

10. The computer-readable storage medium of claim 8, wherein the actuation mechanism includes:

a piezo-electric actuator;

an electro-static actuator;

an electro-thermal actuator; or an inductive actuator.

11. The computer-readable storage medium of claim 8, wherein the desired alignment of the first chip with respect to the second chip facilitates the data communication between the chip and the second chip.

12. The computer-readable storage medium of claim 8, wherein the method is performed with closed-loop control, wherein the misalignment is automatically determined by the integrated sensor, and the integrated actuator automatically corrects the misalignment.

13. The computer-readable storage medium of claim 8, wherein the method is applied to a set of chips, such that the method automatically detects and corrects the misalignment of each chip with respect to neighboring chips in the set of chips either during assembly or operation of a system which includes the set of chips.

14. The computer-readable storage medium of claim 8, wherein the misalignment between the first chip and the second chip is caused by at least one of:

movement of the first chip;

thermal expansion or contraction of the first chip or a chip assembly; or vibration of an assembly to which the first chip is affixed.

15. An apparatus for automatically detecting and correcting a misalignment between a first chip and a second chip during a data communication process, during which the second chip transmits a data signal to the first chip, wherein the data signal is transmitted from a first proximity communication structure on the second chip and is received by a second proximity communication structure on the first chip, and wherein each proximity communication structure includes an array of individual proximity communication elements, comprising:

a receiving mechanism on the first chip configured to receive the data signal at the first chip from the second chip, wherein the transmitted data signal is steered through a subset of the individual proximity communication elements in the first proximity communication structure;

a position-detection sensor integrated with the first chip and configured to determine a misalignment of the first chip with respective to the second chip based at least on a signal strength of the received data signal, wherein the position-detection sensor is configured to determine the misalignment by:
- detecting the individual proximity communication elements in the second proximity communication structure that receive the transmitted data; and
- determining the relative positions of the first and second chips based on the sending and receiving individual proximity communication elements; and an actuation mechanism integrated with the first chip and configured to automatically correct a detected misalignment between the first chip and the second chip, wherein the automatically detecting and correcting of the misalignment are performed concurrently with the data communication process.

16. The apparatus of claim 15, wherein the position-detection sensor includes:
- an optical sensor;
- a capacitive sensor;
- an inductive sensor; or
- a conductive sensor.

17. The apparatus of claim 15, wherein the actuation mechanism includes:
- a piezo-electric actuator;
- an electro-static actuator;
- an electro-thermal actuator; or
- an inductive actuator.

18. The apparatus of claim 15, wherein the desired alignment of the first chip with respect to the second chip facilitates the data communication between the first chip and the second chip.

19. The apparatus of claim 15, wherein the position-detection mechanism and the actuation mechanism are arranged to form a closed-loop control, wherein the misalignment is automatically determined by the integrated sensor, and the integrated actuator automatically corrects the misalignment.

* * * * *